United States Patent [19]

Kaya et al.

[11] Patent Number: 5,428,578
[45] Date of Patent: Jun. 27, 1995

[54] BIASING CIRCUIT AND METHOD TO ACHIEVE COMPACTION AND SELF-LIMITING ERASE IN FLASH EEPROMS

[75] Inventors: Cetin Kaya, Dallas; Wayland B. Holland, Garland; Rabah Mezenner, Richardson, all of Tex.

[73] Assignee: Texas Instruments Incorporated, Dallas, Tex.

[21] Appl. No.: 106,095

[22] Filed: Aug. 12, 1993

[51] Int. Cl.⁶ ............................................. G11C 16/02
[52] U.S. Cl. .................................. 365/218; 365/185; 365/900
[58] Field of Search ...................... 365/218, 185, 900

[56] References Cited

U.S. PATENT DOCUMENTS

| | | | |
|---|---|---|---|
| 4,797,856 | 1/1989 | Lee et al. | 365/185 |
| 5,220,528 | 6/1993 | Mielke | 365/185 |
| 5,220,533 | 6/1993 | Turner | 365/218 |
| 5,331,592 | 7/1994 | Yamagata | 365/185 |
| 5,357,463 | 10/1994 | Kinney | 365/185 |
| 5,357,466 | 10/1994 | Hong | 365/185 |
| 5,357,476 | 10/1994 | Kuo et al. | 365/218 |
| 5,361,235 | 11/1994 | Kodama | 365/218 |

FOREIGN PATENT DOCUMENTS 2189346  10/1987  United Kingdom ................ 365/185

*Primary Examiner*—Joseph A. Popek
*Assistant Examiner*—Andren Q. Tran
*Attorney, Agent, or Firm*—Theodore D. Lindgren; Leo N. Heiting; Richard L. Donaldson

[57] ABSTRACT

The erasing method of this invention results in a relatively narrow distribution of threshold voltages when used to flash erase a group of floating-gate-type memory cells (10). Each cell includes a control gate (14), a source (11) and a drain (12). The method comprises connecting the control gates (14) to a control-gate voltage (Vg), connecting the sources (11) to a source voltage (Vs) having a higher potential than the control-gate voltage (Vg) and connecting the drains (12) to a drain subcircuit (DS) having, in at least one embodiment, a potential (Vd) between the control-gate voltage (Vg) and the source voltage (Vs), the drain subcircuit (DS) having a sufficiently low impedance to allow current flow between the sources (11) and drains (12) at a time during the erasing operation. The drain subcircuit (DS) allows for optimum threshold voltage distribution and a part of the drain potential (Vd) may be fed back to arrest the erase process at an optimum point.

21 Claims, 8 Drawing Sheets

BIASING CIRCUIT AND METHOD TO ACHIEVE COMPACTION AND SELF-LIMITING ERASE IN FLASH EEPROMS

BACKGROUND OF THE INVENTION

The present invention relates to a nonvolatile, integrated-circuit memory array such as an electrically erasable and programmable read-only-memory (EEPROM) array. In particular, this invention relates to a circuit and method for flash-erasing EEPROMs, the method resulting a fighter distribution of positive erased threshold voltages.

EEPROMs using hot-carrier-injection programming, as opposed to Fowler-Nordheim tunneling programming, are described in: (a) "A Single Transistor EEPROM cell and its implementation in a 512K CMOS EEPROM," S. Mukherjee et al., IEDM 1985 (p. 616-619) and in (b) "A 90 ns 100K Erase/Program Cycle Megabit Flash Memory,." V. Kynett et al., ISSCC 1989 (p. 140-141). The topic of reference (a) is also discussed in U.S. Pat. No. 4,698,787.

Using prior-art Fowler-Nordheim tunnel erasing methods for non-split-gate memory-cell arrays, a positive voltage is applied to the source of each cell, the control gates of the cells are grounded and the drains of the cells are allowed to float. In practice, the term "float" means a high-impedance connection to one or more voltages. A high-impedance connections may be, for example, a field-effect transistor biased in a non-conducting state.

One of the problems arising in flash EEPROMs is over-erasure of cells. An over-erased cell has a positive charge, causing the channel under the floating gate to be conductive. That over-erased conductive cell short circuits other cells in its column of parallel-connected cells. One method to compensate for over-erasure is to form the flash EEPROMs with split gates. Another method is to program all of the EEPROM cells, then apply light erasing pulses in steps, checking after each step to see whether or not all of the cells are erased. Other methods include applying alternating programming and erasing steps as described, for example, in U.S. Pat. No. 5,132,935 issued Jul. 21, 1992, and in U.S. Pat. No. 5,122,985 issued Aug. 16, 1992 and the references therein. Both patents relate to compaction, or narrowing, of the threshold voltage distributions of flash-erased cells and both patents are assigned to Texas Instruments Incorporated.

Another problem associated with prior-art flash EEPROMs has been a wide distribution of threshold voltages after a flash erase operation. One of the major challenges in current single-transistor cell flash EEPROMs is to maintain a tight threshold voltage distribution after electrical erase. One solution to the problem requires an erase algorithm that scans the voltage threshold of every cell of the device prior to terminating the erase operation. Other solutions to the problem include process and/or circuit-design improvements to narrow or "compact" the voltage threshold distribution after erase.

Patent application Ser. No. 085,427 filed Jun. 30, 1993, also assigned to Texas Instruments Incorporated, describes a flash-programming method for compacting a wide voltage threshold distribution by allowing a current path between source and drain, and with the additional requirement that the junction at lower bias should have a positive voltage (greater than about +1V with respect to the substrate). The flash-programming step narrows the distribution of threshold voltages to a range of positive values after a previously performed flash erase procedure.

Other methods have been proposed to compact the distribution of threshold voltages. One of those methods uses wordline stress to cause Fowler-Nordheim injection of electrons into the floating gate during a flash-programming step. Another flash-programming method relies on hot-electron injection into the gate and is described in "A Self-Convergence Erasing Scheme for a Simple Stacked Gate Flash EEPROM", Yamada, et al., IEDM 1991 (p. 11.4.1-11.1.4).

SUMMARY OF THE INVENTION

Using the circuit and method of this invention, a low-level current is allowed to flow between source and drain during the erase operation when the drain-column line potential rises above a certain level, generally greater than +1V. This low-level current corrects the part of the voltage-threshold distribution caused by "fast" bits, or cells having a tendency to over-erase (cells that tend to have negative threshold voltages when using prior-an flash-erase methods). Termination or extension of the erase operation is controlled. For example, when the threshold voltages of the main population of memory cells are at a desired value (the value is detected by the amount of conduction current at the drain side), the erase operation is terminated by increasing the control-gate voltage or by decreasing the source voltage through feedback. The termination may be controlled to occur upon the voltage thresholds of the main population of cells reaching a desired range of values.

When used to flash erase an array of memory cells, the efficient, tolerant compaction circuit and method of this invention result in a relatively narrow distribution of positive threshold voltages.

An advantage of the circuit and method is the elimination of the use of an erase algorithm such as that described above. Another advantage is the simplification of peripheral circuitry, including the reduction of space overhead for that circuitry. In addition, the circuit and method are easy to implement and result in shorter erase time.

As applied to a group of floating-gate-type memory cells in which each cell includes a control gate, a source and a drain, the method comprises connecting the control gates to a control-gate voltage, connecting the sources to a source voltage having a higher potential than the control-gate voltage and connecting the drains to a drain subcircuit furnishing a varying potential to the control-gate, the subcircuit having a sufficiently low impedance to allow current flow between the sources and drains at a time during the erasing operation.

DETAILED DESCRIPTION OF THE INVENTION

Figure 1:
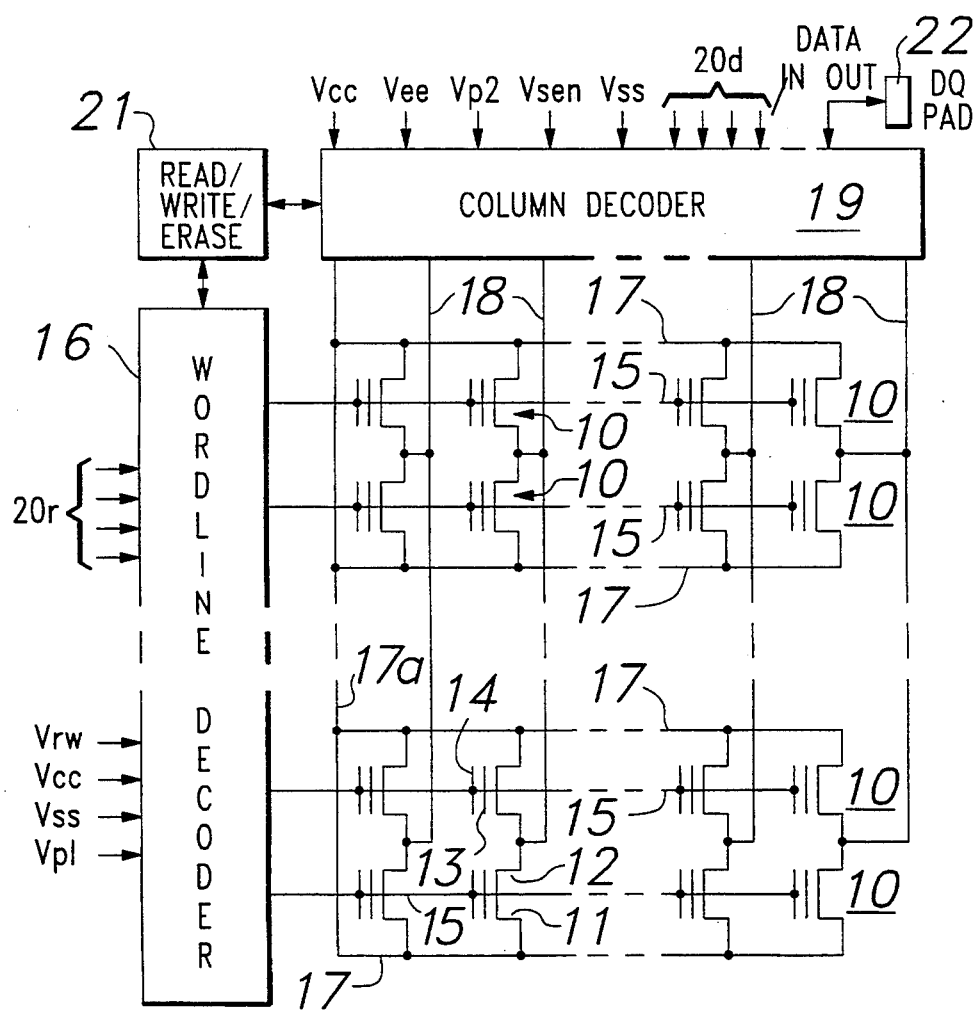
FIG. 1 is an electrical schematic diagram, in partial block form, of a nonvolatile; memory cell array.

Referring to FIG. 1, an example array of memory cells, which is an integral part of a memory chip, is shown for the purpose of illustrating use of the method of this invention. Each cell is a floating-gate transistor 10 having a source 11, a drain 12, a floating gate 13, a control gate 14. Each of the control gates 14 in a row of cells 10 is connected to a wordline 15, and each of the wordlines 15 is connected to a wordline decoder 16. Each of the sources 11 in a row of cells 10 is connected to a source line 17. Each of the drains 12 in a column of cells 10 is connected to a drain-column line 18. Each of the: source lines 17 is connected by a common-column line 17a to a column decoder 19 and each of the drain-column lines 18 is connected to the column decoder 19.

In the read mode, the wordline decoder 16 functions, in response to wordline address signals on lines 20r and to signals from microprocessor 21, to apply a preselected positive voltage Vcc (approx. +5V) to the selected wordline 15, and to apply a low voltage (ground or Vss) to deselected wordlines 15. The column decoder 19 functions to apply a preselected positive voltage Vsen (approx. +1V) to at least the selected drain-column line 18 and to apply a low voltage (0V) to the source line 17. The column decoder 19 also functions, in response to signal on address lines 20d, to connect the selected drain-column line 18 of the selected cell 10 to the DATA IN/OUT terminal. The conductive or nonconductive state of the cell 10 connected to the selected drain-column line 18 and the selected wordline 15 is detected by a sense amplifier (not shown) connected to the DATA IN/OUT terminal 22.

In a write, or program, mode the wordline decoder 16 may function, in response to wordline address signals on lines 20r and to signals from Read/Write/Erase control circuit 21, (or microprocessor 21 ) to place a preselected first programming voltage Vp1 (approx. +12V) on a selected wordline 15, including a selected control-gate 14. Column decoder 19 also functions to place a second programming voltage Vp2 (approx. +5 to +10V) on a selected drain-column line 18 and, therefore, the drain 12 of selected cell 10. Source lines 17 are connected to reference potential Vss, which may be ground. All of the deselected drain-column lines 18 are connected to reference potential Vss or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2V to −6V with respect to the channel region (with Vp1 at 0V). For memory cells 10 fabricated in accordance with the example embodiment, the coupling coefficient between a control gate 14/wordline 15 and a floating gate 13 is approximately 0.6. Therefore, a programming voltage Vpl of 12V, for example, on a selected wordline 15, including the selected control gate 14, places a voltage of approximately +7.2V on the selected floating gate 13. The voltage difference between the floating gate 13 (at approx. +7.2V) and the grounded (approx. 0v) source line 17 is insufficient to cause a Fowler-Nordheim tunneling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

During a prior-art flash-erase mode, the column decoder 19 functions to leave all drain-column lines 18 floating (connected to a high impedance such as field-effect transistor biased in "OFF" condition). The wordline decoder 16 functions to connect all the wordlines 15 to reference potential Vss, which may be ground. The column decoder 19 also functions to apply a high positive voltage Vee (approx. +9V to +15V) to all the, source lines 17. These erasing voltages create sufficient field strength across the gate oxide region to generate a Fowler-Nordheim tunnel current that transfers charge from the floating gate 13, erasing the memory cell 10. Since the potential on the wordline 15 is 0V, the source-drain path of cell 10 remains in the nonconducting state during erase. For that reason, and also by reason of the fact that the drain 12 is floated, no channel-hot carriers are generated using the prior-art method.

As explained in greater detail below, this invention describes a circuit and method for allowing current to flow through the channel of each cell 10 during the flash erase operation. During that erase operation, the drains 12 are connected to a circuit that allows source-drain conduction after the drain voltage rises to a potential greater than about +1V with respect to the substrate.

For convenience, a table of read, write voltages, as well as both prior-art and presently-disclosed erase voltages, is given in TABLE I below:

TABLE I

|  | Read | Write | Flash Erase (Prior-Art) | Flash Erase (Herein Described) |
| --- | --- | --- | --- | --- |
| Selected Wordline | 5 V | 12 V | 0 V (All) | 0 V plus feedback (All) |
| Deselected Wordlines | 0 V | 0 V | — | — |
| Selected Drain Line | 1.0 V | 5–10 V | Float (All) | 0–2 V time varying (All) |
| Deselected Drain Lines | 0 V/Float | 0 V/Float | — | — |
| Source Lines | 0 V | 0 V | 10–15 V (All) | 10–15 V (All) |

Figure 2:
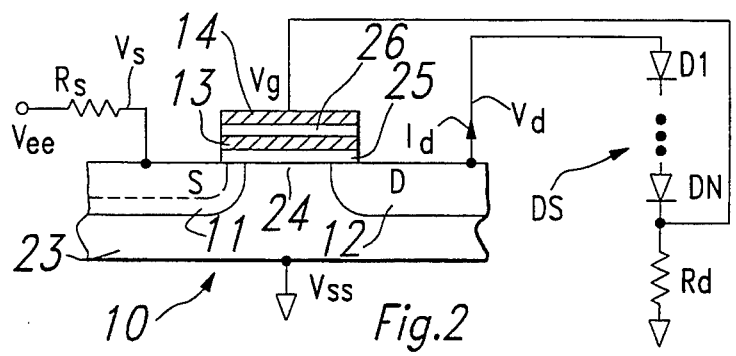
FIG. 2 illustrates a biasing configuration to achieve compaction and self-limiting erase.

FIG. 2 is a cross-section of a typical floating-gate cell 10 of the type used in the memory cell array of FIG. 1. Source 11 and drain 12 are formed by impurity diffusion in a semiconductor substrate 23 having impurity of the opposite-type as the source 11 and drain 12 diffusions. The source 11 is typically formed by a diffusion of two types of impurities. The substrate 23 area between the source 11 and the drain 12 is the cell channel 24. The floating gate 13 is formed from a layer of polysilicon insulated from the channel 24 by gate insulator 25. The polysilicon control gate 14, which is a part of the wordline 15 of FIG. 1, is insulated from the floating gate 13 by and interlevel insulator 26.

This invention may best be explained by reference to data obtained from experiments on a test structure of ten thousand incomplete memory cells 10. The test structure is similar to an actual array of cells 10 except that process for fabricating floating-gate memory cells 10 is stopped at a point after the polysilicon floating gates 13 and the polysilicon control gate 14 layer are formed. The source 11 and drain 12 diffusions are formed using the same procedure as that used in forming an array of complete cells 10. Programming and erasing is accomplished by applying voltages to probes connected to the control-gate 14 polysilicon, to the source-lines 17, and to the drain-column lines 18.

The method disclosed herein achieves a compact voltage distribution as well as a self-limiting-erase by connection of the drain-column lines 18 and wordlines 15 to a special network. As in erase operations of prior-art, the source lines 17 are connected to source voltage Vee through a load resistor (or a P-channel select transistor). However, instead of leaving the drain-column lines 18 floating as in the prior-art, the method herein connects all of the drain-column lines 18 to a common drain voltage Vd, controlled by a drain subcircuit DS. The drain subcircuit DS allows a conduction current Id between the source lines 17 and the drain-column lines 18 when the drain voltage Vd reaches about +1.0 to 1.5V. In the prior-art method the drains 12 were connected to a high impedance, eliminating current flow through the channels of the cells 10. Therefore, the hot-electron-injection phenomenon was suppressed, resulting in a wider distribution of erased threshold voltage than that achieved by the method described herein. Injection current, defined here to mean the current at which hot-electron injection occurs, is source-drain current of about 10 nanoamperes per cell 10, using current cell construction techniques. It is understood, of course, that hot-electron injection is a function of both time and current. That is, hot-electron injection can take place at lower currents if the programming time interval is increased.

FIG. 2 shows a biasing circuit connected to a cell 10 without split gate, the cell 10 shown in cross-section. The biasing circuit of FIG. 2 achieves compact distribution of erased threshold voltages and achieves self-limiting erase operation. During the erase operation, the cells 10 that tend to over-erase (so-called "fast bits") are erased faster than the typical, or average cells 10. The floating gate 13 potential of the fast bits rises in the positive direction much faster than the floating gate 13 potential of average cells 10. When the drain-column line 18 potential exceeds approximately +1.4V (two diode-voltage drops), current Id flows from source lines 17, through the channels of the fast bits, to the drain-column lines 18, then to ground via diodes D1-DN and resistor Rd. (As is well-known in the art, the term "resistor" as used herein implies use of any suitable impedance, such as transistor.) Because the drain 12 bias is higher than +1V, the current Id induces hot-electron injection into the floating gates 13. This hot-electron injection counterbalances the Fowler-Nordheim tunneling current, slowing (or controlling) the rate of erase of the fast bits. Also, because the percentage of fast bits is normally low (0.1–1%), the current Id flowing through the resistor Rd is insufficient to raise the gate potential and slow the erase operation of average bits.

To slow the erase operation of average bits, the control-gate voltage Vg is increased or the source voltage Vs is decreased, or a combination of both. As the voltage thresholds of average bits approach their ultraviolet-erasure voltage thresholds, the conduction current from source line 17 to the drain-column line 18 increases. This, in turn, increases the voltage drop across the resistor Rd and hence the control-gate voltage Vg. If the resistor Rd value is chosen sufficiently large, the erase operation is slowed by the rising control-gate voltage Vg. If the resistor Rd value is chosen sufficiently small, the erase operation. is also slowed primarily by the decreasing source potential Vs, which is caused by the large voltage drop across the source load resistor Rs.

The circuit attached to the drain-column lines 18 samples the state of the array in two distinct modes. First, the circuit checks for rising drain-column line potential Vd. When the drain-column line potential Vd is above a preset value (determined by lie number and voltage thresholds of the diodes D1–DN), the subcircuit DS allows a conduction path between source lines 17 and drain-column lines 18 to compensate, or slow erasure of the fast bits by hot electron injection into the floating gates 13 (in situ compaction during erase). Second, the subcircuit DS samples the amount of conduction current Id through the resistor. When, the conduction current Id exceeds a preset value, the circuit applies a positive voltage to the wordlines 15 of the array to slow, or to self-limit, the erase operation.

FIGS. 3A–6B and 8A–10B facilitate understanding of the method of this invention. The Figures illustrate the improvement in compaction of threshold voltages Vt in test structures having about 10,000 cells after application of various erasing methods to that array. The extent of compaction is characterized by graphs of drain current Id variiation as the control-gate voltage Vg varies from −1V to +4V after the various compaction procedures have been performed. With no over-erased cells 10, the drain current Id does not begin to flow until control-gate 14 voltage Vg reaches positive values. However, the leakage current value of Id, measured with control-gate voltage Vg at 0V, is a measure of the number over-erased cells as well as a measure the extent of that over-erasure. A narrow distribution of threshold voltages Vt is indicated by a drain current Id curve with both a constant slope and a steep slope. A drain current Id curve without a constant slope indicates that some cells 10 begin conducting before others as the control-gate voltage Vg is increased. A rather steep, straight-line slope indicates that the cells 10 begin conduction at the same value of Vg as the control-gate voltage Vg is increased and, therefore, indicating a compact distribution of threshold voltages Vt. The graph of transconductance Gm indicates change in drain current Id divided by change in control-gate voltage Vg. The control-gate voltage Vg at the peak of the Gm curve corresponds to the threshold voltage Vt of a typical cell 10.

Figure 3A:
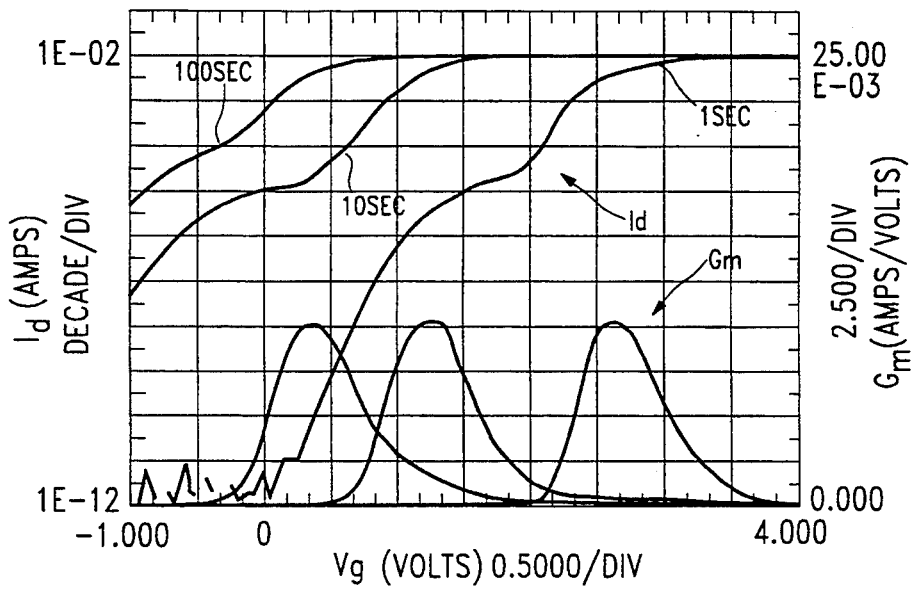
FIG. 3A illustrates the erase characteristics of a flash array known to have a population of cells with a tendency to over-erase, or go into depletion during flash erase operation.

FIG. 3A shows the above-described measure of compaction for an erased flash array known to have a distinct fast-bit population. The erase characteristics are shown for the array after the array has been erased by application of a voltage Vee of +11.4V to the sources 11 through a 33 Kilohm resistor Rs with the control gates 14 at 0V and the drains 12 floating (connected to a high resistance). The circuit of FIG. 2 is not used in this test. Graphs of the variation in Id as Vg varies from −1V to +4V are shown for three array erasures in which the foregoing voltages were applied for 1, 10 and 100 seconds. Each of the erase operations results in a wide threshold-voltage distribution, with the voltage thresholds Vt of the main distribution going further into depletion as the erase time increases, as indicated by the current Id at negative values of Vg.

While experimental erase times of 1, 10 and 100 seconds were used in the tests conducted, it should be understood that the erasing operation times may range from perhaps 0.1 to 150 seconds, with slower erase times generally less desirable.

Figure 3B:
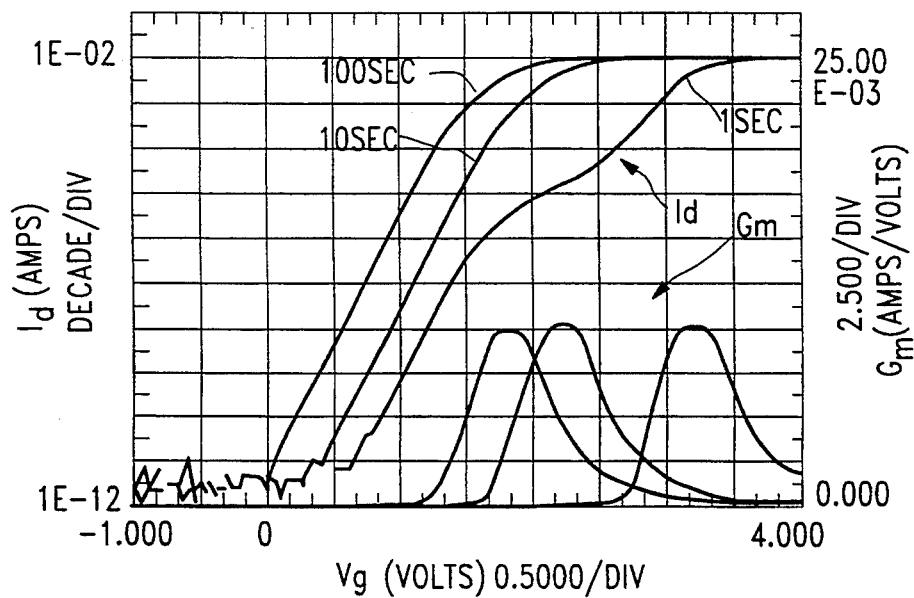
FIG. 3B illustrates erasure of the array of FIG. 3A using the circuit of FIG. 2 and, in particular, illustrates that the normally over-erased cells do not go into depletion.

FIG. 3B shows the above-described compaction characteristic for the same erased flash array, but with two diodes in the D1–DN chain and with a 220 Kilohm resistor Rd in series between the drains 12 and ground. The control gate feedback connection to control gates 14 as shown in FIG. 2 was used during the erase procedure. The array was erased by application of a voltage Vee of +11.4V to the parallel-connected sources 11 through a 33-Kilohm resistor Rs. Graphs of the variation in Id as Vg varies from −1V to +4V are shown for three array erasures in which the foregoing voltages were applied for 1, 10 and 100 seconds. The compaction characteristics of FIG. 3B indicate that the East bits are under control and that the voltage threshold distribution of the main population of cells does not go into depletion.

Figure 4A:
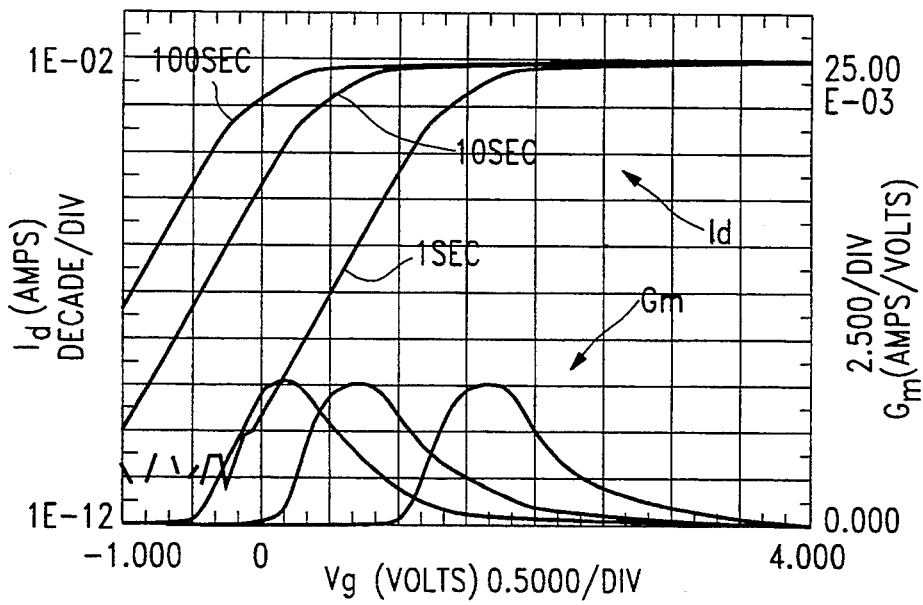
FIG. 4A illustrates the erase characteristics of an array erased using the circuit of FIG. 2 using two diodes and a 220K resistor load, but with no gate feedback (gate shorted to ground) and, in particular, illustrates that the main threshold voltage distribution is not prevented from going into depletion with erasure times of 1, 10 and 100 seconds.
Figure 4B:
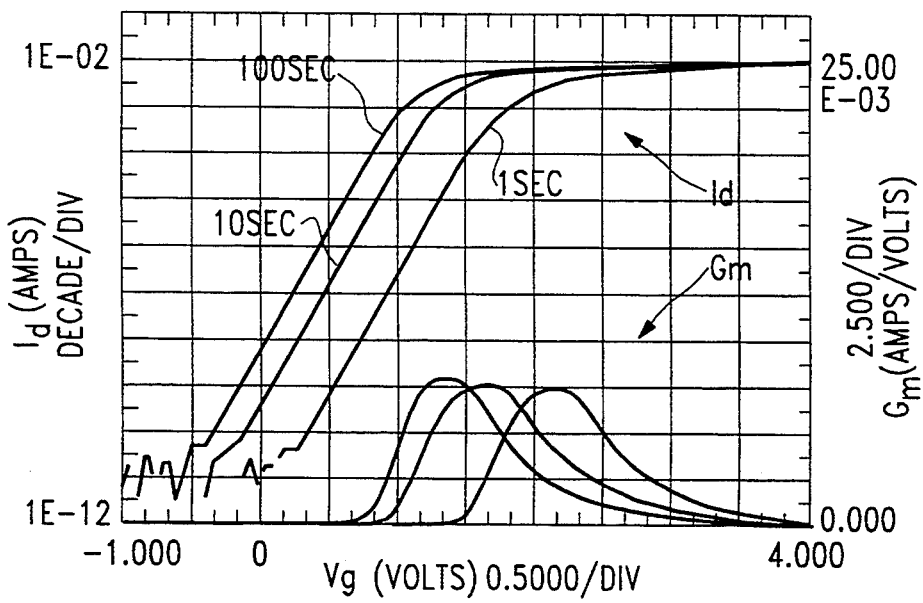
FIG. 4B corresponds to the FIG. 4A, but illustrates the effect of the gate feedback of the circuit of FIG. 2 on the erase characteristics of the same array and, in particular, illustrates that the main threshold voltage distribution is prevented from going into depletion.

FIGS. 4A and 4B illustrate the effects of control gate 14 feedback on the voltage threshold distribution of the final array. Again, the circuit of FIG. 2 is used to measure the compaction after erase, the circuit of FIG. 2 comprising two diodes in the D1–DN chain plus a 220 Kilohm resistor Rd in series between the drains 12 and ground. The control gate 14 feedback connection to control gates 14 at feedback terminal 27 as shown in FIG. 2 is not used. Instead, the control gates 14 are connected to ground (Vg =0V). The compaction characteristics are shown for an array after the array has been erased by application of a voltage Vee of +11.4V to the sources 11 through a 33-Kilohm resistor Rs with the control gates 14 at 0V. Graphs of the variation in Id as Vg varies from −1V to +4V are again shown for three array erasures in which the foregoing voltages were applied for 1, 10 and 100 seconds. As shown in FIG. 4A, without control gate 14 feedback the voltage thresholds Vt of the main distribution go further into depletion as the erase time increases, as indicated by the current Id at negative values of Vg. FIG. 4B illustrates the same array erased with the control gate 14 feedback of the circuit of FIG. 2. As FIG. 4B illustrates, the control gate 14 feedback prevents many of the threshold voltages Vt of cells 10 from going into depletion.

Figure 5A:
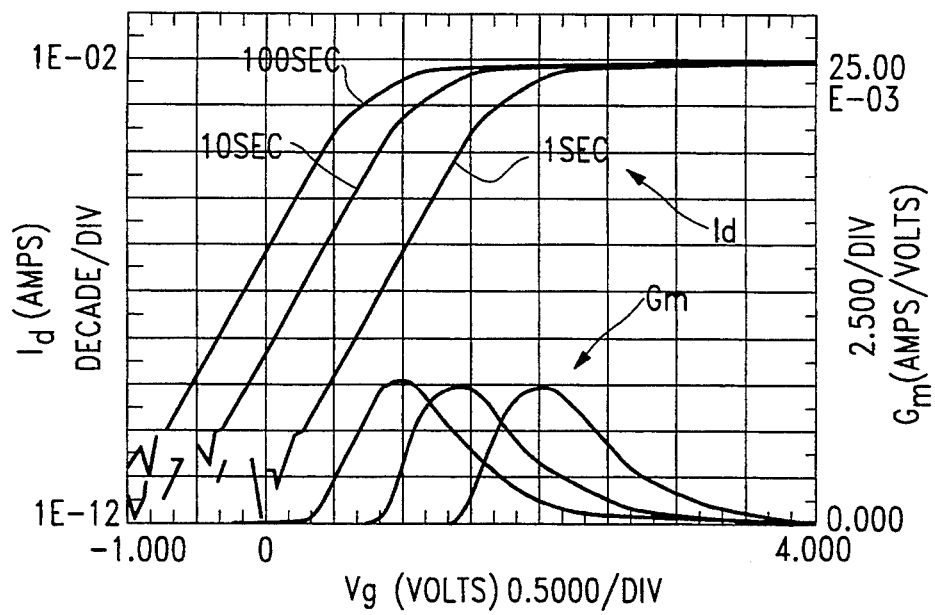
FIG. 5A shows the 1, 10 and 100 second erase characteristics far the array using a resistor Rd having a value of 27 Kilohms and without the feedback connection of FIG. 2.
Figure 5B:
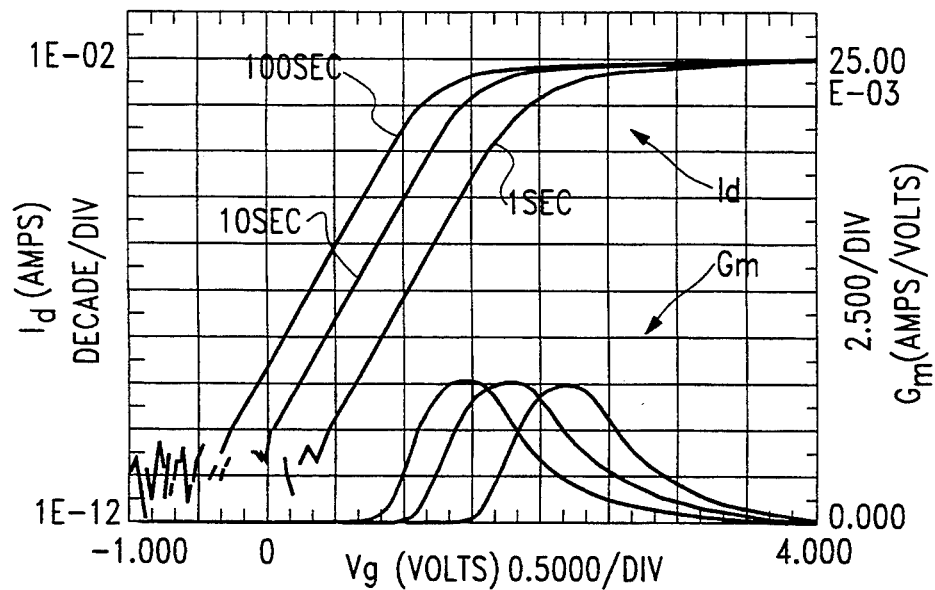
FIG. 5B shows the 1, 10 and 100 second erase characteristics for the same array using a resistor Rd having a value of 27 Kilohms with the feedback connection of FIG. 2.
Figure 6A:
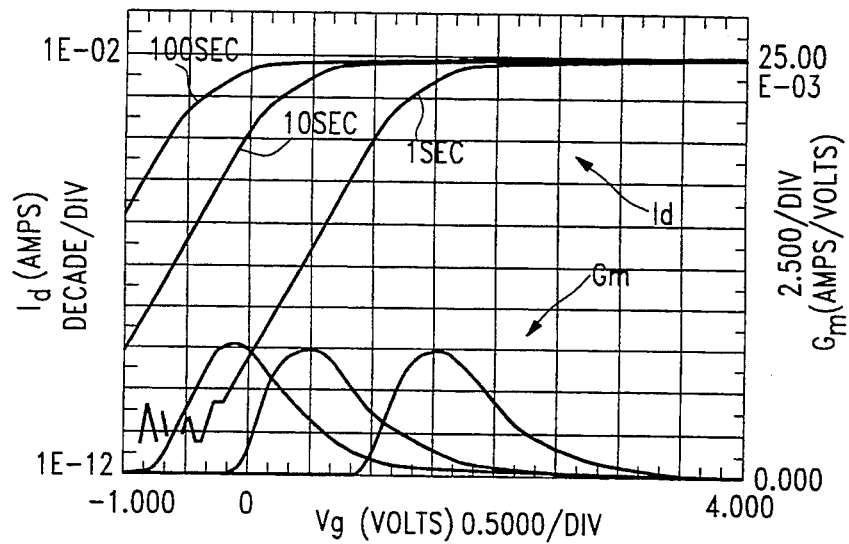
FIG. 6A shows the 1, 10 and 100 second erase characteristics for the array using a resistor Rd having a value of 1 Megohm and with no feedback.
Figure 6B:
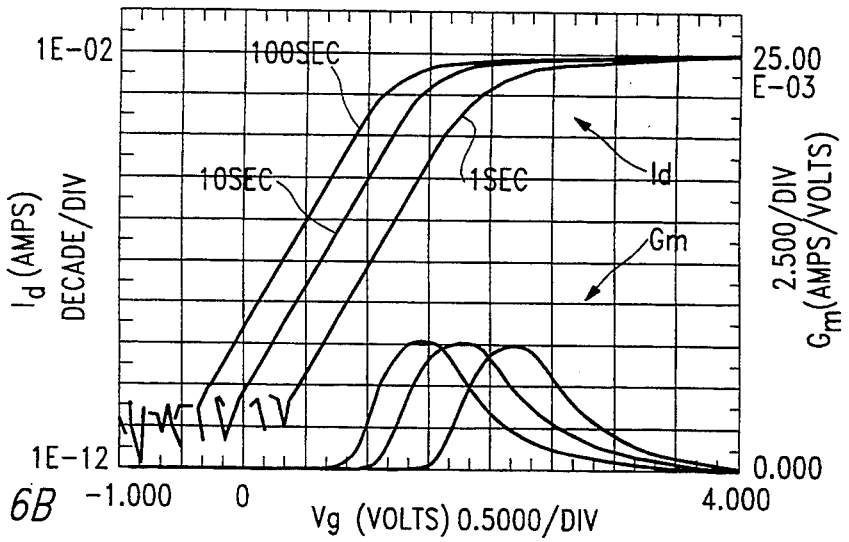
FIG. 6B shows the 1, 10 and 100 second erase characteristics for the same array using a resistor Rd having a value of 1 Megohm, but with feedback.

FIGS. 5A, 5B, 6A, 6B show the erase characteristics of the same array with and without gate feedback using different values of resistance Rd, with and without control gate 14 feedback. Specifically, FIG. 5A shows the 1, 10 and 100 second erase characteristics for the array using a resistor Rd having a value of 27 Kilohms and without the feedback connection of FIG. 2 (Vg=0V). FIG. 5B, on the other hand, shows; the 1, 10 and 100 second erase characteristics for the same array using a resistor Rd having a value of 27 Kilohms with the feedback connection of FIG. 2. FIG. 6A shows the 1, 10 and 100 second erase characteristics for the array using a resistor Rd having a value of 1 Megohm and with no feedback. FIG. 6B, on the other hand, shows the 1, 10 and 100 second erase characteristics for the same array using a resistor Rd having a value of 1 Megohm, but with feedback. The results using control gate 14 feedback show very similar erase characteristics over the wide range of resistance Rd values. However, when the control gate 14 feedback is removed, the voltage threshold distributions of the array are not consistent.

As is apparent from the above experiments, use of control gate 14 feedback results in slowing of the erase characteristic of the array toward the end of the erase operation. As discussed below, the erase operation is completely stopped by increasing the gain in the feedback loop.

Figure 7:
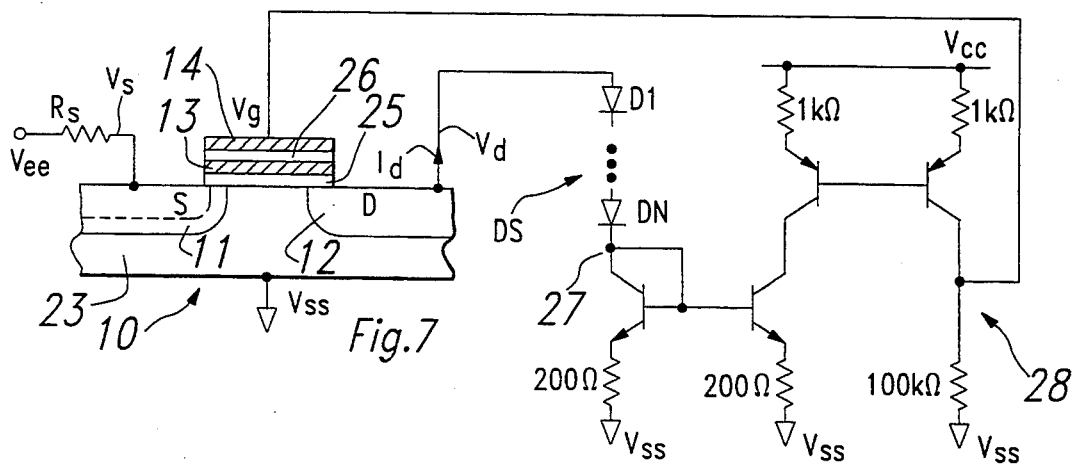
FIG. 7 illustrates an erasing circuit with increased gain in the feedback loop.

FIG. 7 shows a high-gain feedback circuit for stopping, or self-limiting, the erase operation. The circuit of FIG. 7 is similar to the circuit of FIG. 2, with the difference that a feedback amplifier 28 is used to transmit the voltage at feedback terminal 27 to control gates 14. While the feedback amplifier illustrated is in bipolar form, it is recognized by those familiar with the art that many forms of feedback amplifiers may be used to perform the desired function described herein.

Figure 8A:
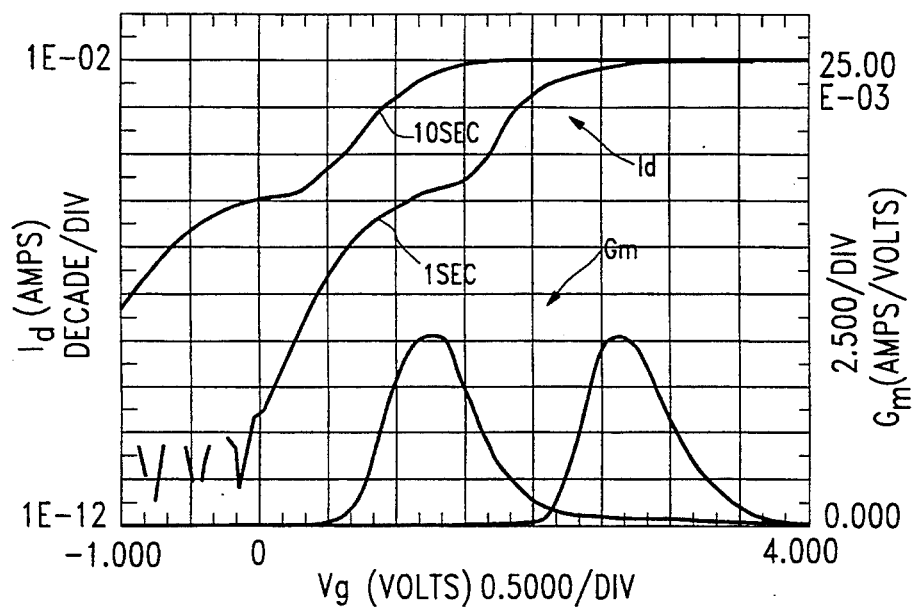
FIGS. 8A and 8B illustrate the erase characteristics of an array with fast bits, FIG. 8A without the feedback of the circuit of FIG. 7 and FIG. 8B with the: feedback of the circuit of FIG. 7.
Figure 8B:
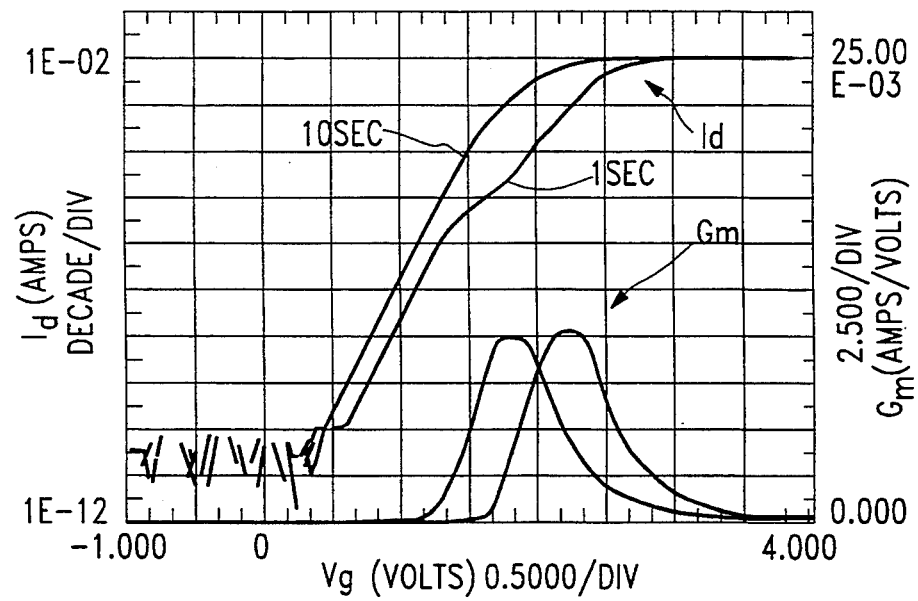

FIGS. 8A and 8B illustrate the erase characteristics of an array with fast bits, FIG. 8A without the feedback of the circuit of FIG. 7 and FIG. 8B with the feedback of the circuit of FIG. 7. As shown by comparison of the erase characteristics, the feedback circuit of FIG. 7 prevents the fast bits from going into depletion. Erase characteristics are shown for erase times are one and ten seconds using values of Vee=11.4V, Rs=33 Kilohms and Rd=100 Kilohms.

Figure 9:
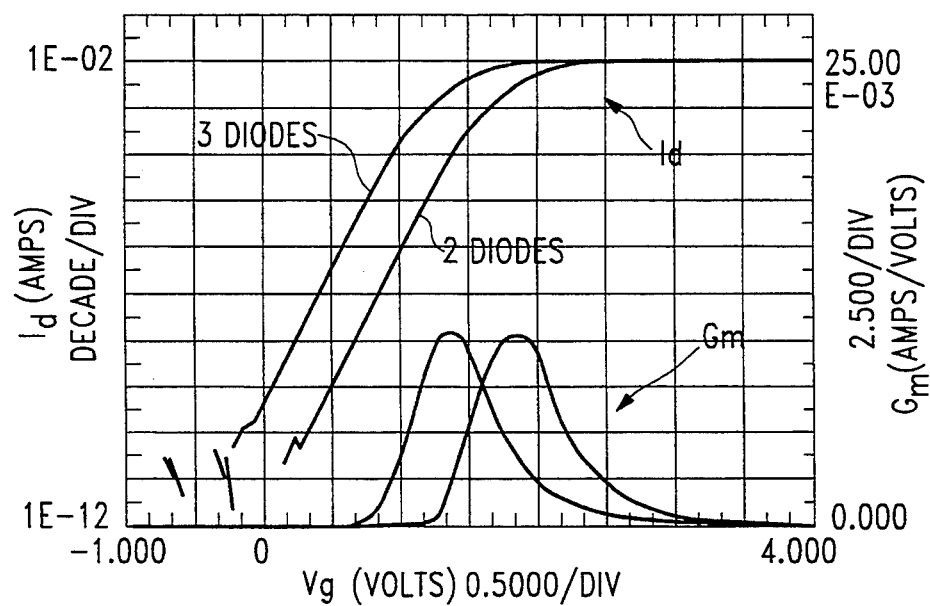
FIG. 9 illustrates the erase characteristics of the network of FIG. 7 with two diodes and with three diodes and, in particular, illustrates that a higher number of diodes lowers the average voltage threshold of the array.

FIG. 9 illustrates the erase characteristics of the network of FIG. 7 two diodes and with three diodes and, in particular, illustrates that a higher number of diodes lowers the average voltage threshold of the array. When the high-gain feedback circuit of FIG. 7 is used, the cells do not go into depletion and the erase operation is completely stopped at a predetermined voltage threshold. That is, the application of further erase pulses beyond this point does not change the voltage threshold distribution of the array at all.

The final, or saturated, voltage threshold distribution of the array is controlled by the number of diodes the D1-DN diode chain in the circuit of FIG. 7. The higher the number of diodes in the D1-DN chain, the later the control gate 14 feedback turns on, and the lower the threshold voltages Vt of the array. As illustrated in FIG. 9, the addition of the third diode to the two-diode configuration lowers the final voltage threshold by about one diode-voltage-threshold drop.

From a reliability point of view, there is a lower limit for the number of diodes in the D1-DN chain (or a lower limit of the voltage at which the current conduction is allowed to fix fast bits). That lower limit is believed to result from the injection hot holes into the floating gate 13.

Figure 10A:
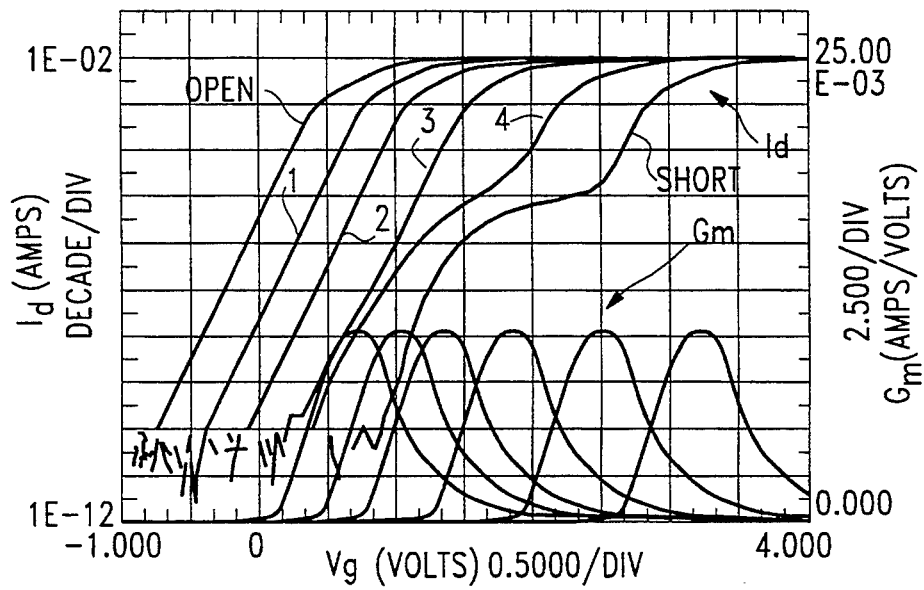
FIGS. 10A and 10B illustrate the erase characteristics of two different arrays using the network of FIG. 2 with the control gates grounded and with the drains tied to Found through different numbers of diodes and also illustrate that a higher number of diodes lowers the average voltage threshold of the array.
Figure 10B:
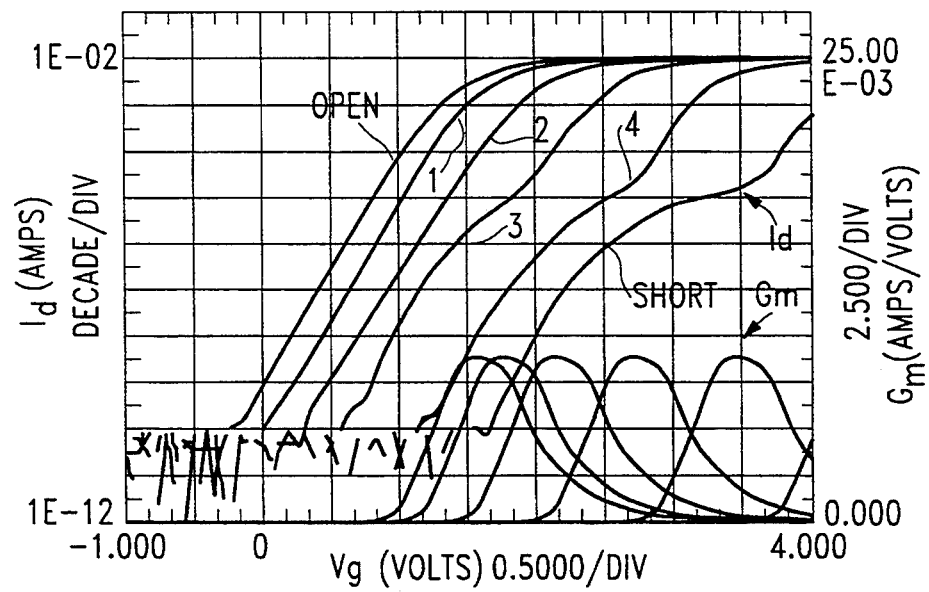

FIGS. 10A and 10B show the erase characteristics of two different test arrays with the drain-column lines 18 tied to ground through various numbers of diodes in the D1-DN diode chain of FIG. 2 and with no feedback (Vg=0V, Rd=0). As FIGS. 10A and 10B illustrate, the number of diodes necessary to arrive at a standard erase characteristic varies from one array to another. As can be seen from subthreshold current-voltage characteristics, there is a strong hot-hole-injection component with one diode. Hot-hole injection decreases with two diodes and becomes undetectable with three diodes in the D1-DN diode chain.

While the examples above have discussed only one type of floating-gate cell 10, this invention is useful in nonvolatile memories using any type of non-split-gate nonvolatile memory cell 10.

The experimental data herein describes certain bias conditions for drains 12 and other bias conditions for sources 11. In many cases, the general bias conditions for sources 11 and drains 12 are reversible, yet accomplish the same result. Therefore, the terms "source" and "drain" as used herein are interchangeable as used in this text, including the claims.

While this invention has been described with respect to an illustrative embodiment, this description is not intended to be construed in a limiting sense. Upon reference to this description, various modifications of the illustrative embodiment, as we, 11 as other embodiments of the invention, will be apparent to persons skilled in the art. It is contemplated that the appended claims will cover any such modifications or embodiments that fall within the scope of the invention.

We claim:

1. A method for erasing a number of floating-gate-type memory cells; each said memory cell including a control gate, a source and a drain; said method comprising:
   connecting said control gates to a control-gate voltage having a gate potential with respect to a reference potential;
   connecting said sources to a source voltage having a source potential with respect to said reference potential, said source potential higher than said gate potential;
   connecting said drains to a drain subcircuit having a drain potential increasing during said erasing and having a sufficiently low impedance to allow injection current flow between said sources and drains at a time during said erasing.

2. The method of claim 1, wherein said control-gate voltage has a potential equal to said reference potential.

3. The method of claim 1, wherein said number of cells is ten thousand and wherein said source voltage is obtained from a voltage supply in the range of +9V to +12V with respect to said reference potential connected to said sources through an impedance having a value of approximately 33 Kilohms.

4. The method of claim 1, wherein said drain potential of said drain subcircuit reaches a value equal to or greater than +1V with respect to said reference potential at some time during said erasing.

5. The method of claim 1, wherein said drain subcircuit includes a connection of at least one forward-biased diode between said drains and a terminal having, at some time during said erasing, a terminal potential lower than said drain potential.

6. The method of claim 1, wherein said gate potential is caused to increase with respect to said reference potential as said drain potential increases with respect to said reference potential.

7. The method of claim 1 further including a feedback amplifier, wherein said gate potential is caused by said feedback amplifier to increase with respect to said reference potential as said drain potential increases with respect to said reference potential.

8. The method of claim 1, wherein said gate potential is increased to stop erasing when said number of cells has a predetermined range of voltage threshold values.

9. The method of claim 1, wherein said control-gate and source voltages are applied for a period of time in the range of 0.1 to 150 seconds.

10. The method of claim 1, wherein said step of connecting said drain subcircuit to said drains attains a threshold voltage distribution of positive voltages for said number of floating-gate-type memory cells.

11. The method of claim 1, wherein said source voltage is decreased as said drain potential increases.

12. The method of claim 1, each said memory cell further including a substrate, wherein said method includes connecting said substrate to said reference potential.

13. A circuit for erasing a number of floating-gate-type memory cells; each said memory cell including a control gate, a source and a drain; said circuit comprising:
   a reference voltage terminal;
   a source voltage connected to said sources;
   a control-gate voltage connected to said control gates, said control gate voltage less than said source voltage but equal to or greater than said reference voltage;

a drain subcircuit connected to said drains and said reference voltage terminal, said drain subcircuit including at least one forward-biased diode connected to allow conduction between said source and drain when the drain potential increases to a positive value with respect to a reference potential at said reference voltage terminal.

14. The circuit of claim 13, wherein said control-gate voltage is the voltage at said reference voltage terminal.

15. The circuit of claim 13, wherein said number of cells is ten thousand and wherein said source voltage is supplied by a voltage source in the range of +9V to +12V with respect to the voltage at said reference voltage terminal in series with an impedance having a value of approximately 33 Kilohms.

16. The circuit of claim 13, wherein said drain subcircuit has a drain voltage that reaches a value equal to or greater than +1V with respect to the voltage at said reference voltage terminal at some time during said erasing.

17. The circuit of claim 13, including at least one forward-biased diode connected between said drains and a terminal having, at some time during said erasing, a voltage lower than the voltage at said drains.

18. The circuit of claim 13, wherein said control-gate voltage is the voltage at a feedback terminal, wherein said drain subcircuit includes at least one forward-biased diode connected between said drains and said feedback terminal, and wherein said drain subcircuit includes an impedance connected between said feedback terminal and said reference potential.

19. The circuit of claim 18, further including a feedback amplifier, wherein said drain subcircuit includes at least one forward-biased diode connected between said drains and said feedback terminal, and wherein said drain subcircuit includes said impedance connected between said feedback terminal and said reference voltage terminal, and wherein the output of said feedback amplifier is said control-gate voltage and wherein the input of said feedback amplifier is connected to said feedback terminal.

20. The circuit of claim 13, wherein said source and control-gate voltages are applied for a period of time in the range of 0.1 to 150 seconds.

21. The circuit of claim 13, wherein the number of said diodes is chosen to attain a distribution of positive threshold voltage values.

* * * * *